United States Patent

Ohmi

[11] Patent Number: 5,563,092
[45] Date of Patent: Oct. 8, 1996

[54] METHOD OF PRODUCING A SUBSTRATE FOR AN AMORPHOUS SEMICONDUCTOR

[75] Inventor: Kazuaki Ohmi, Yokohama, Japan

[73] Assignee: Canon Kabushiki Kaisha, Tokyo, Japan

[21] Appl. No.: 231,066

[22] Filed: Apr. 22, 1994

[30] Foreign Application Priority Data

Apr. 23, 1993 [JP] Japan .................................. 5-098022
Apr. 1, 1994 [JP] Japan .................................. 6-065195

[51] Int. Cl.$^6$ ....................................................... H01L 21/20
[52] U.S. Cl. .................... 437/101; 437/233; 204/192.12; 118/723 E; 118/723 MW
[58] Field of Search .................................. 437/101, 233; 118/723 MP, 723 MW, 723 ME, 723 MR, 723 MA, 723 HC, 723 E, 723 ER, 723 I; 204/192.1, 192.12, 192.23

[56] References Cited

U.S. PATENT DOCUMENTS

| | | | |
|---|---|---|---|
| 4,057,476 | 11/1977 | Krokorian et al. | 204/192 P |
| 4,064,521 | 12/1977 | Carlson | 357/2 |
| 5,116,482 | 5/1992 | Setoyema et al. | 118/723 E |

FOREIGN PATENT DOCUMENTS

| | | | |
|---|---|---|---|
| 5-216990 | 2/1977 | Japan | H01L 31/04 |
| 54-086341 | 9/1979 | Japan | H01L 31/08 |
| 63-050025 | 3/1988 | Japan | H01L 21/31 |
| 5-009721 | 1/1993 | Japan | 204/192.1 |

OTHER PUBLICATIONS

R. C. Chittick, et al. "The Preparation and Properties of Amorphous Silicon", J. Electrochemical Soc., vol. 116, pp. 77–81 (1969).
D. P. Turner, et al., "The Growth and Properties of Bias–Sputtered a–Si–H", AIP Conf. Proceedings, pp. 47–51 (1981).
M. H. Brodsky, et al. "Quantitative Analysis of hydrogen in glow discharge amorphous silicon", Applied Physics Letters, vol. 30, pp. 561–563 (1977).
W. E. Spear, "Substitutional Doping of Amorphous Silicon", Solid State Communications, pp. 1193–1196 (1975).
D. L. Miller, et al., "Some Properties of Evaporated Amorphous Silicon made with atomic hydrogen", J. Applied Physics, vol. 49, pp. 6192–6193 (1978).
W. Paul, et al. "Doping, Schottky Barrier and p–n Junction Formations in Amorphous Germanium and Silicon By rf Sputtering", Solid State Communications, vol. 20, pp.969–972 (1976).
T. D. Moustakas, "Studies of Thin–Film Growth of Sputtered Hydrogenated Amorphous Silicon", Solar Energy Materials, vol. 8 (pp. 187–204) (1982).

*Primary Examiner*—R. Bruce Breneman
*Assistant Examiner*—Ramamohan R. Paladugu
*Attorney, Agent, or Firm*—Fitzpatrick, Cella, Harper & Scinto

[57] ABSTRACT

A substrate for use to form an amorphous semiconductor having excellent characteristics, and an amorphous semiconductor substrate comprising a substrate of this kind are disclosed. A method of producing the amorphous semiconductor substrate is also disclosed. An amorphous semiconductor such as a—Si, a—Si alloys, or the like is deposited on a substrate by utilizing an RF plasma having a frequency greater than 50 MHz in an atmosphere whose partial gas pressure associated with a residual gas other than inert gas and hydrogen is less than $10^{-8}$, while applying a bias voltage including a DC component to the substrate during the deposition process. The present invention is characterized in that the substrate has a surface layer having an amorphous structure wherein electric charges may move at least through said surface layer.

31 Claims, 4 Drawing Sheets

METHOD OF PRODUCING A SUBSTRATE FOR AN AMORPHOUS SEMICONDUCTOR

BACKGROUND OF THE INVENTION

1. Field of the Invention

The present invention relates to a substrate for an amorphous semiconductor, an amorphous semiconductor substrate comprising a substrate of this type, and a method of producing the amorphous semiconductor substrate. More specifically, the present invention relates to a substrate suitable for use to form an amorphous silicon or amorphous silicon-based semiconductor layer having excellent characteristics; an amorphous semiconductor substrate comprising a substrate of this type and an amorphous silicon or amorphous silicon-based semiconductor layer formed on the substrate; and a method of producing the amorphous semiconductor substrate.

2. Description of the Related Art

Amorphous silicon (a—Si) based semiconductors are used in a wide variety of electronic devices including light sensitive materials for electrophotography, imaging tubes, solid-state imaging devices, TFTs, solar cells, etc.

There are various known techniques to deposit an amorphous semiconductor containing Group IV elements, such as a—Si, a—SiGe, a—SiC, a—SiN, a—SiO, etc. These techniques include vapor evaporation, sputtering, and CVD such as plasma-assisted CVD and photo-assisted CVD. Of these techniques, a high frequency plasma-assisted CVD became widely used because it can provide high quality deposition for a—Si. In this technique, a film is deposited on a substrate by subjecting semiconductor source gas, for example a silane compound such as $SiH_4$, to the decomposition using 13.56 MHz RF glow discharging. This technique was proposed first by R. C. Chittic et. at., (Journal of Electrochemical Society, Vol. 166, p. 77 (1969)). W. E. Spear et. at., (Solid State Communications, Vol. 17, p. 1193 (1975)) succeeded in pn control of electrical conductivity by impurity doping of an amorphous semiconductor. Their success attracted much attention, and induced a lot of subsequent technical developments in various applications including a solar cell (Japanese Patent Laid-Open No. 52-16990), a light sensitive material for electrophotography (Japanese Patent Laid-Open No. 54-86341), etc.

There have been various attempts to improve this technique, such as dilution of semiconductor source gas with hydrogen or Ar gas, utilization of a higher frequency than 13.56 MHz, control of substrate biasing, and utilization of electron cyclotron resonance in magnetic field.

An a—Si film deposited by a plasma-assisted CVD technique contains hydrogen in the range from a few % to several tens % (Applied Physics Letters, Vol. 30, No. 11, p. 561 (1977)). From the fact that an a—Si deposition film containing 10%–20% hydrogen shows better characteristics (photoconductivity, controllability of electric conductivity of impurity-doped material, etc.) than a—Si deposition films containing no hydrogen, it became appreciated that it is important that an a—Si film contains hydrogen.

From this view point, various techniques to supply hydrogen during film deposition processing have been investigated. For example, great positive effects can be obtained if hydrogen is supplied during the film deposition process of vapor evaporation (Journal of Applied Physics, Vol. 49, No. 12, p. 6192 (1978)).

As a variation of a sputtering technique in which a semiconductor target such as Si is sputtered by an Ar gas plasma, a reactive sputtering technique has been investigated (Solid State Communications, Vol, 20, p. 969 (1976)). In this technique, hydrogen gas is mixed with Ar gas which serves as a discharging gas, and a target is sputtered using a radio frequency ("RF") plasma of this mixed gas at a frequency of about 13.56 MHz, while inducing the reaction with deposition elements, thereby depositing an amorphous film on a substrate disposed at a location opposite to the target. This technique has succeeded in producing a fairly high quality a—Si film including a rather small amount dangling bonds.

The sputtering technique has an advantage that it does not need an expensive and hazardous semiconductor production gas or such a gas which is difficult to stock for long periods of time. Therefore, this technique does not need an expensive and large-scale protection system such as an apparatus for altering a hazardous gas into a safer form, a gas leakage alarm system, or a highly protected cylinder cabinet. It needs only very simple and inexpensive peripheral facilities.

Attempts to further improve this technique have been done. An example is a bias sputtering technique in which a substrate is biased during the sputtering process (AIP Conference Proceedings, Vol. 73, p.47 (1981), Solar Energy Materials, Vol. 8, p. 187 (1982)). Another example is to increase the discharging frequency up to much higher than 13.56 MHz so that the substrate bias may control $Ar^+$ ions better, thereby improving the quality of a deposited a—Si film without the help of hydrogen. In addition, this technique can prevent the deposited film and the substrate from being damaged by ions. Thus, it is possible to obtain an a—Si film containing a lesser amount of hydrogen, which leads to a reduction in photo-induced degradation of photoelectric characteristics.

An a—Si film which has good photoelectric characteristics and does not show photo-induced degradation may be produced for example by reducing the concentration of hydrogen as well as the concentration of dangling bonds. To deposit such a high quality a—Si film, the deposition process should be controlled to a higher degree than in the case of conventional deposition techniques. In particular, the control of the substrate biasing is important, because it determines the amount of ions as well as energy of ions which are incident on the substrate during the deposition process, wherein the amount and energy of ions affect the quality of the deposited film.

However, in conventional plasma CVD or sputtering techniques, it is difficult to achieve sufficiently good controllability of the substrate biasing to obtain a high quality film.

For example, in a widely used RF frequency such as 13.56 MHz, ion energy of a plasma has a wide distribution. As a result, it is difficult to control the ion energy incident on the substrate, even if the substrate biasing is rigidly controlled. This problem can be solved if the discharging frequency is increased up to higher than 50 MHz so as to make the ion energy distribution sharper.

FIG. 1 schematically shows ion energy distributions of RF plasmas for a frequency of 13.56 MHz and a higher frequency than that. From FIG. 1, it can be seen that the 100 MHz plasma shows a sharp ion energy distribution, in contrast to the 13.56 MHz plasma which shows a wide ion energy distribution having two peaks.

To control substrate biasing, the substrate should have a sufficiently low resistance. A glass substrate is popular as a substrate for a—Si deposition. However, its resistance is high. Therefore, a glass substrate is unsuitable for the application of substrate biasing. Even if a very thin glass substrate having a thickness of about 0.1 mm is used and if its back surface is in contact with an electrode, self biasing will occur at the other surface which is in contact with the plasma. As a result, the DC bias application to the electrode is useless to control the substrate biasing. One known technique to avoid this problem is to apply a second RF power to the electrode that is in contact with the back surface of the substrate (Japanese Patent Laid-Open No. 63-50025). However, the control of this technique is limited to a narrow range. In particular, it is difficult to achieve a large positive magnitude of biasing.

An a—Si film can be deposited on a substrate other than an amorphous substrate such as a glass substrate, if the temperature of the substrate is maintained low enough. For example, it is possible to deposit a—Si on a metal crystal substrate such as a stainless steel substrate or an Al substrate which is held at about 250° C.

However, in this technique, the migration of deposited atoms on the surface of a substrate is sacrificed, and degradation in characteristics such as photoelectric conduction often occurs.

This problem can be avoided if the substrate temperature is raised to a higher temperature, or if the reactive gas used in the plasma CVD process is diluted with hydrogen to a sufficient degree. However, in this case, the film will be often crystallized, which will bring about difficulty in producing an a—Si film.

This problem may also occur in a—Si deposition using plasma CVD. But, in particular, this problem is serious in a technique in which a—Si is deposited by bias sputtering under the conditions where the RF power frequency is higher than 50 MHz and the partial pressure of residual impurity gas other than Ar and $H_2$ is less than 10−8 torr. In this technique, if Si is deposited on a Si single crystal wafer under optimized conditions, a Si single crystal epitaxial layer can be grown at a low temperature in the range from 250° C. to 400° C. This occurs because the surface of the growing film is excited by the $Ar^+$ bombardment whereby Si atoms have a large mobility on the surface of the growing film. One technique to deposit an amorphous film keeping a high surface mobility is to use a substrate whose surface is amorphous. However, if an amorphous material such as glass is used as a substrate, another problem is the high resistance of the amorphous substrate which gives rise to difficulty in applying the bias potential to the substrate.

SUMMARY OF THE INVENTION

It is an object of the present invention to provide a method of depositing amorphous Si, which is capable of controlling the deposition process without the problems relating to the substrate biasing described above.

It is another object of the present invention to provide a substrate suitable for a—Si deposition, and an a—Si semiconductor substrate comprising a substrate of this type.

It is another object of the present invention to provide a substrate suitable for use as a substrate on which an amorphous semiconductor is deposited by utilizing an RF plasma having a frequency greater than 50 MHz in an atmosphere whose partial gas pressure associated with the residual gas other than inert gas and hydrogen is less than $10^{-8}$, wherein a bias voltage including a DC component is applied to the substrate during the deposition process, the substrate being characterized in that the substrate has a surface layer having an amorphous structure, wherein electric charges may move at least through the surface layer.

It is another object of the present invention to provide an amorphous semiconductor substrate having an amorphous semiconductor deposited on a substrate by utilizing an RF plasma having a frequency greater than 50 MHz in an atmosphere whose partial gas pressure associated with a residual gas other than inert gas and hydrogen is less than $10^{-8}$, wherein a bias voltage including a DC component is applied to the substrate during the deposition process, the amorphous semiconductor substrate being characterized in that the substrate has a surface layer having an amorphous structure wherein electric charges may move at least through the surface layer, and that the amorphous semiconductor is formed on the above-described surface layer.

It is another object of the present invention to provide a method of producing an amorphous semiconductor substrate using an apparatus comprising at least: a DC power source for applying a bias voltage between a target and a substrate wherein the target disposed at a location opposite to the substrate on which an amorphous semiconductor is to be formed; and an RF power source for applying RF power between the target and the substrate; wherein an amorphous semiconductor containing at least an element included in the target is formed on a substrate by utilizing an RF plasma having a frequency greater than 50 MHz in an atmosphere whose partial gas pressure associated with a residual gas other than inert gas and hydrogen is lower than $10^{-8}$, while applying a bias voltage including a DC component to the substrate during the deposition process; the method being characterized in that the method includes a step of forming a surface layer having an amorphous structure on the above-described substrate.

DESCRIPTION OF THE PREFERRED EMBODIMENTS

As for a substrate on which an a—Si-based material such as a—Si or an a—Si alloy is to be deposited, it is important that at least its surface should have an amorphous structure so that epitaxial growth may not occur even if deposition atoms have high mobility on the surface of the substrate. The substrate is required to have such a structure that can prevent not only homo-epitaxial growth but also hetero-epitaxial growth on the substrate. To deposit an a—Si based material in a large area, nucleation should also be suppressed. To satisfy these requirements, the surface of the substrate should have a uniform amorphous structure.

Figure 1:
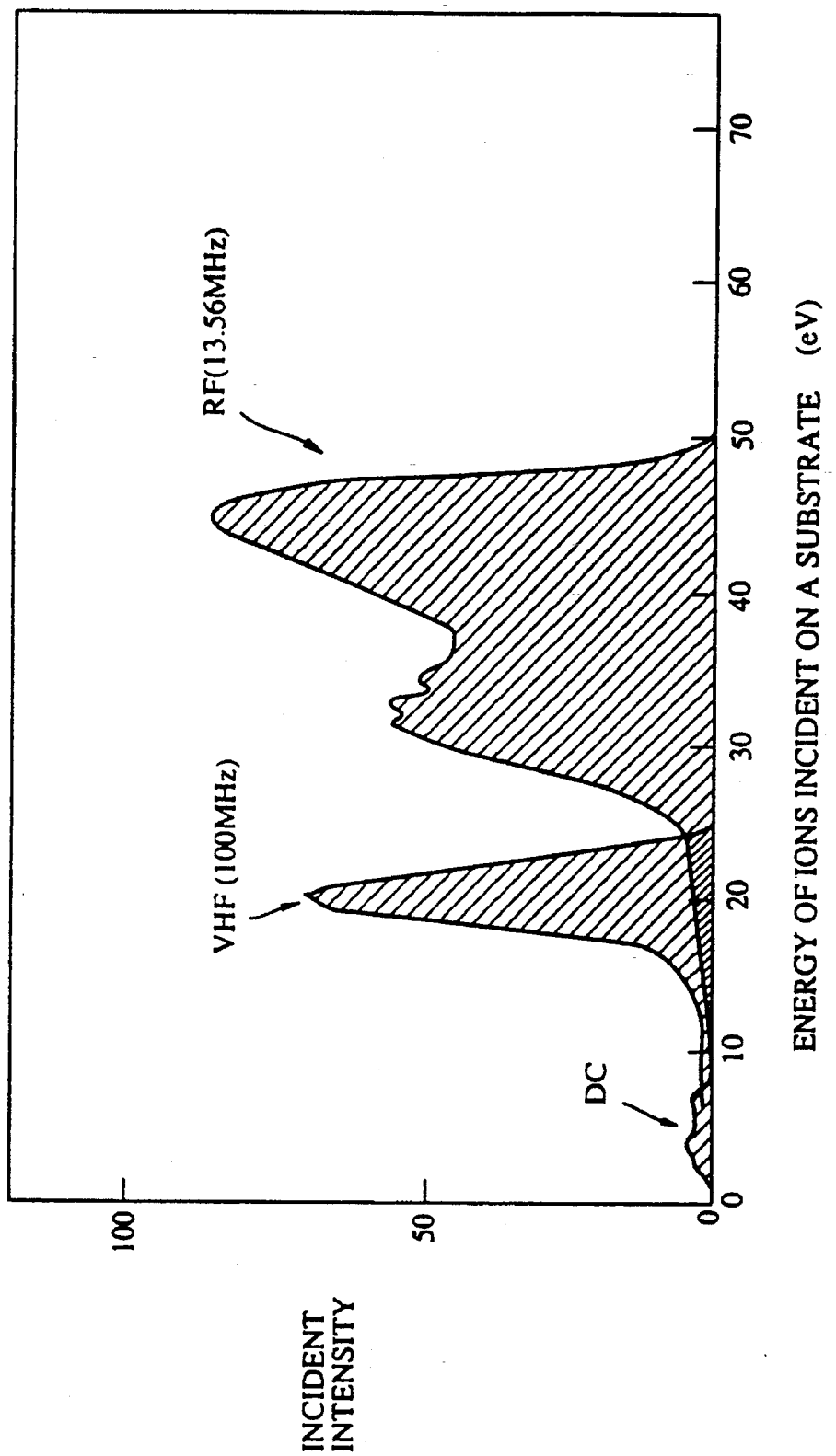
FIG. 1 is a schematic representation of ion energy distributions of 13.56 MHz and a higher frequency RF plasma.
Figure 2:
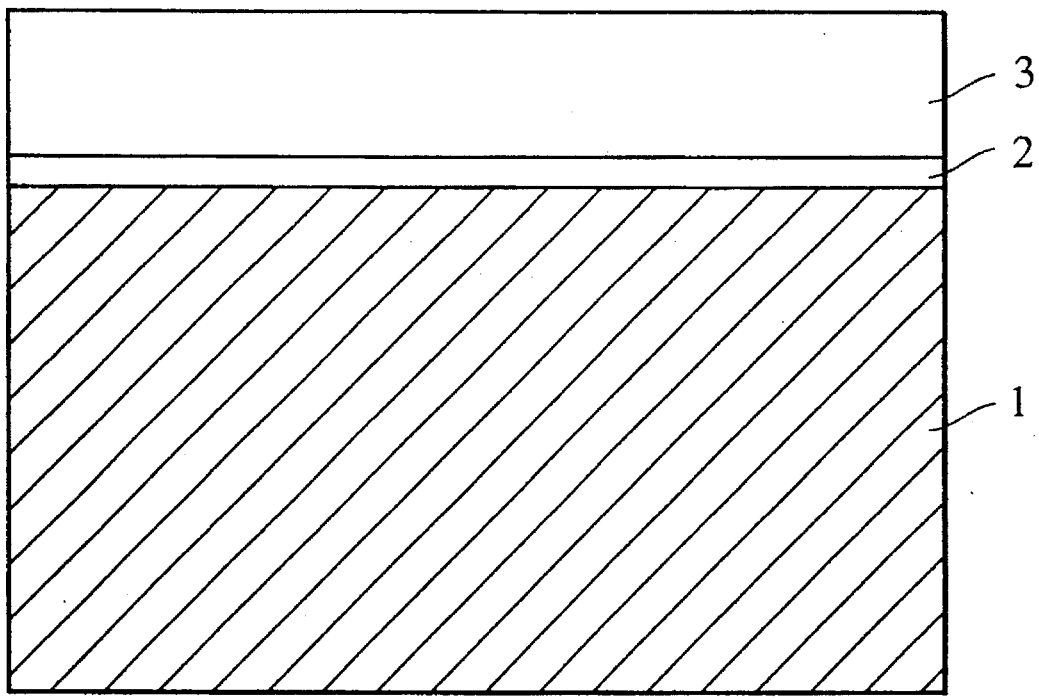
FIG. 2 is a schematic diagram illustrating an a—Si film formed on a substrate according to the present invention.

FIG. 2 schematically illustrates a cross section of an a—Si film formed on a substrate according to the present invention, wherein reference numeral 1 denotes a substrate, reference numeral 2 denotes an amorphous layer, and reference numeral 3 denotes an a—Si layer. Preferably, the surface of the amorphous layer 2 should be as flat as possible, and as free of contaminants as possible. The flatness is not necessarily essential, however it is desirable that local irregularities of the surface be at least less than 100 nm, or more preferably less than 10 nm. The preferable surface flatness depends on the surface mobilities of deposited atoms or reaction precursors. To deposit a film having a uniform amorphous structure, it is desirable that the surface of a substrate be clean. While it is difficult to rigidly define the required degree of cleanness, various kinds of cleaning techniques which are usually used to clean a substrate for a—Si deposition or those which are widely used in production of semiconductor devices, such as sulfuric acid cleaning, hydrofluoric acid cleaning, or a combination of these, can be used to obtain a sufficiently good result.

The amorphous structure at the surface of a substrate can be easily obtained, if a simple glass substrate is employed. However, as discussed above, the employment of glass will give rise to a problem that the very high resistance of the substrate causes the difficulty in applying a bias potential including a DC component to the substrate. Therefore, a substrate for use in the present invention should be an amorphous substrate that has electrical conductivity at least at its surface. An example of such a substrate is a low resistance $p^+$–Si wafer containing a group III element in the periodic table, or $n^+$–Si wafer containing a group V element in the periodic table, wherein its surface is oxidized to form a very thin oxide film through which electronic charges, such as electrons, can pass via the tunnelling effect. Such a thin tunnelling oxide film can be formed for example by subjecting the surface of the Si wafer to the thermal oxidation under appropriate conditions. To obtain a tunnelling oxide film having a uniform thickness, it is effective that the native oxide film present on the surface of the Si wafer is removed by etching, and then the surface of the Si wafer is oxidized slightly and uniformly. A Si wafer doped with a relatively low concentration of impurities may also be used. However, a wafer having as low resistance as possible and having an oxidized surface is more preferable in that a bias potential may be applied to the substrate more reliably. It is preferable for the oxide film to be as thin as possible, as long as the oxide film is formed uniformly on the surface of the Si wafer and there are no defects in the oxide film. A mono-atomic layer of $SiO_2$ is sufficient enough to make the deposited film amorphous. The thicker the thickness of the oxide film is, the more difficult the substrate biasing is. More specifically, an oxide film whose thickness is less than 5 nm is preferable.

A preferable example of thermal oxidation process is after removing the native oxide film of a Si wafer, the Si wafer is oxidized in the nitrogen atmosphere containing about 20% oxygen at 650° C. for a few seconds. By using this technique, it is possible to form a uniform oxide film having a thickness of about 10 Å.

Alternatively, it is also possible to use a substrate made of amorphous metal which is produced by spraying molten metal, such as nickel, to a cooled roll, or by passing it between two cooled rolls so that the molten metal may be quickly cooled and thus amorphous metal may be produced. The amorphous metal produced by this widely used technique is usually very thin. Therefore, preferably, the amorphous metal is made to adhere to a crystalline conductive or an insulating substrate, wherein a bias voltage is directly applied to the amorphous metal in the latter case. Otherwise, the thin amorphous metal may be directly stretched in an adequate manner to use it as a substrate. Alternatively, the thin metal may also be used in a so called roll-to-roll fashion.

It is also possible to use an amorphous substrate having an amorphous tunneling film on a metal substrate, wherein the amorphous tunneling film may be formed by using an appropriate thin film technique such as CVD, electron beam evaporation, or sputtering.

It is also possible to use an amorphous substrate comprising a metal substrate and a metal oxide film or a metal nitride film having an amorphous structure formed on the surface of the metal substrate, if such a structure is available.

In each case, the film formed on the surface of the substrate should have an amorphous structure. The lower resistance, the more preferable. However, the tunneling current flowing through the film is not necessarily essential.

Furthermore, it is also possible to use an amorphous substrate whose surface comprises an organic material having an amorphous structure and having a low resistance. For example, this type of amorphous substrate may be produced in such a manner that a low molecular and electron donative material, such as triphenylamine or triphenylmethane, is added to an amorphous high polymeric organic material such as a polystyrene or polycarbonate resin, and then the electron donative material is partially oxidized by an appropriate technique for example by adding a small amount of low molecular and electron attractive material. If it is desirable to hold an amorphous substrate at a relatively high temperature, it is preferable to select a material having a high molecular weight.

By using an amorphous substrate of the above-described type, that is, an amorphous substrate having an amorphous structure at least in the surface region and exhibiting electrical conductivity, it becomes possible to rigidly control the substrate biasing. In addition, it becomes possible to rigidly control the energy of ions incident on the surface of the substrate, by employing an RF plasma having a frequency preferably higher than 50 MHz, or more preferably higher than 100 MHz, thereby making the ion energy distribution sharp. In contrast, a commonly used RF plasma having a frequency of 13.56 MHz exhibits an energy distribution too wide to perform rigid control of ion energy which is required to perform sufficiently good control of the film deposition process.

The RF plasma techniques for depositing a—Si according to the present invention includes a plasma CVD technique using a reactive gas such as $SiH_4$, a sputtering technique in which a Si target is sputtered by an Ar plasma, etc. Of these techniques, the sputtering technique is more preferable, because the concentration of hydrogen incorporated into a deposited film can be controlled over a wide range by varying the amount of hydrogen gas added to Ar gas, and thus the effects of ion bombardment to the substrate may be more advantageously utilized.

This technique may be applied not only to a—Si, but it may also be applied, in the exact same manner, to a—Si alloys comprising a—Si and additional elements such as C, Ge, N, 0, etc. In the sputtering technique, in addition to a Si target, various kinds of targets such as SiGe, SiC, SiN, or otherwise a variety of combinations of a solid-state target such as Si, Ge, C, SiC, SiN, and a gas material such as $SiH_4$, $GeH_4$, $CH_4$, $N_2$, $NH_3$, etc., which are well known in the art, may be used.

In the RF plasma CVD technique, the plasma of a mixture of the above-described source gases may also be generated according to a technique well known in the art, whereby a—Si alloys may be deposited on a substrate which is biased to an adequate potential.

If Ar gas is mixed with the above-described source gases, the controllability of the deposition process may be improved. Also in this case, it is preferable to employ a frequency higher than 50 MHz, or more preferably, higher than 100 MHz, to rigidly control the ion energy.

When a—Si is deposited according to the present invention, the pressure of gases other than Ar and hydrogen, such as $H_2O$, $N_2$, $O_2$, $CO_2$, etc., should be as low as possible to obtain a high quality film containing a lesser amount of impurities. These gases are undesirable, because they are incorporated into a deposited film and they induce defects in the film. Besides, these gases may probably prevent deposition atoms from moving on the surface during the deposition process. From this point of view, it is preferable to reduce the back pressure of a deposition chamber to a value less than $10^{-6}$ torr, or more preferably, less than $10^{-7}$ torr.

In particular, when it is desirable to enhance the effects which are obtained by a high surface mobility of atoms brought about by ion bombardment, it is preferable to reduce the back pressure to a value less than $10^{-8}$ torr.

As for Ar and hydrogen gases used for the film deposition, it is preferable to use high purity gases. To satisfy this requirement, a gas purifier is preferably used just prior to the introduction of the gases into the deposition chamber. A passivation treatment on the inner faces of SUS pipes, or other techniques known in the art, may be preferably used to avoid the contamination which may occur while the gases pass through the pipes. As for a discharging gas for use in the sputtering for the film deposition, a common inert gas such as He, Ne, Ar, Xe, Kr, etc., may be used as in a conventional sputtering technique. Among these gases, Ar gas is preferable because of its good characteristics and its ease in use. There are differences in atomic weight among these gases, but nevertheless, all these inert gases except He show similar sharp energy distributions for the frequency range higher 50 MHz, in particular, higher than 100 MHz, as opposed to the case of 13.56 MHz which gives rise to great differences in energy distribution between gases. In the case of He, it shows a rather wide energy distribution. However, it can offer a small degree of ion damage. Taking these characteristics into consideration, the most desirable one can be selected from these gases depending on requirements. A mixture of two or more of these gases may also be used if required. The discharging pressure is preferably in the range from a few mTorr to a few tens mTorr, however it is not exclusively limited to this range.

If the amount of ions of the inert element gas is too small relative to that of Si atoms which are incident on a substrate during the deposition process, then the ions may not cause the Si atoms to move sufficiently enough on the substrate surface to bring about the structure relaxation, which may result in degradation in film quality.

In the case of Ar, a preferable atomic ratio Ar/Si is in the range higher than about 0.1. The atomic ratio Ar/Si can be controlled by the target biasing, the substrate biasing, the discharging power, the discharging pressure, etc.

The optimum partial pressure of hydrogen mixed with the inert gas depends on other parameters. Therefore it is impossible to determine the optimum value separately from other parameters, however, in general, a few mTorr or less than that will be enough to obtain good results, and 1 mTorr or less than that may lead to fairly good results.

Regarding a technique to introduce the gases into the deposition chamber in which the film deposition is to be performed, an inert gas such as Ar gas may be mixed with a controlled amount of hydrogen and then the mixed gas may be introduced into the deposition chamber, or alternatively, hydrogen and inert gas such as Ar may be separately introduced at controlled flow rates into the deposition chamber so that they are mixed in the inside of the chamber.

The introduction of hydrogen gas causes the reduction of dangling bonds present in deposited films of a—Si based materials. The amount of hydrogen atoms relative to that of inert atoms such as Ar is preferably greater than 0.1 at %. If the relative amount of hydrogen is less than 0.1 at %, the addition of hydrogen may have no effects in most cases. In contrast, in the case where the relative amount of hydrogen is greater than 0.1 at %, the hydrogen may be effectively incorporated into the deposited a—Si film.

Hydrogen included as an impurity in the discharging gas, or hydrogen present as a residual gas in the deposition chamber may not be used effectively unless there is intentionally added hydrogen, because such hydrogen cannot be controlled, and thus it gives rise to uncontrolled characteristics of a deposited a—Si film. Because hydrogen has a strong effect on the characteristics of a—Si, it is desirable to introduce a controlled amount of hydrogen. The amount of hydrogen and inert gas such as Ar may be controlled by a simple flow meter, however, it is more preferable to use a mass flow meter or the like which can control the mass of flowing gas. The control of the amount is essential, and the manner of controlling the amount is not limited to any special one.

The atomic ratio between hydrogen and the inert gas such as Ar may be varied during the deposition process as required. This can be achieved by directly using one of the techniques which are well known in sputtering or plasma CVD, or by using a technique modified from these techniques. As for hydrogen, in addition to hydrogen having a molecular weight of about 1.0 which is present most abundantly, isotopes such as deuterium or tritium may also be used. If it is required to grow crystalline Si, hydrogen is not required. The presence of hydrogen during the growth process of crystalline Si sometimes induces crystal defects. The addition of hydrogen can have an excellent effect in the deposition of a—Si. As for a target material for the deposition of a—Si, high purity polycrystalline Si or single crystal Si may be used. Both types of Si targets are available commercially. These targets may be made amorphous once, if desired. In general, a high purity target material is desirable, however, if required, it may also be possible to use a material containing a specific impurity for controlling the electrical conductivity of the film, for example a Group Vb element such as P, As, Sb, a Group IIIb element such as B, Al, Ga, or other elements such as Li, Bi can be used to control the electrical conductivity. This type of impurity included in the target will be incorporated at a considerably high efficiency into the deposited film, whereby the deposited film will exhibit n-type or p-type conductivity.

The target may contain hydrogen or inert elements such as Ar, however, in general, it is more preferable to supply gas-state hydrogen a gas-state inert element such as Ar into the deposition chamber to achieve better controllability.

Furthermore, a—SiGe, a—SiC, a—SiSn, a—SiN, and a—SiO may be deposited by using a corresponding alloy target such as SiGe, SiC, SiSn, SiN, and SiO, respectively. The composition ratios of alloy elements and the concentration of the impurity may be controlled by appropriately selecting the concentration ratios of targets.

A combination of different targets, for example, Si and Ge, Si and graphite, Si and Sn, etc., may also be used. In the present invention, a—SiGe can be deposited by using a reactive sputtering technique without using expensive and explosive gas such as GeH$_4$ which is necessary in a plasma CVD technique. Therefore, the reactive sputtering is much more advantageous in that source materials are inexpensive, and that it is possible to simplify a gas supply system, a gas leakage alarm system, and an exhaust gas treatment system. In the case of a—SiN, a—SiO, or the like, a part of component elements may be supplied in the gas state. Therefore, these films may be deposited by using a target comprising only Si with a plasma of the component element gas mixed with Ar as well as hydrogen. Various conventional sputtering techniques may also be applied to the above-described deposition of films.

Figure 3:
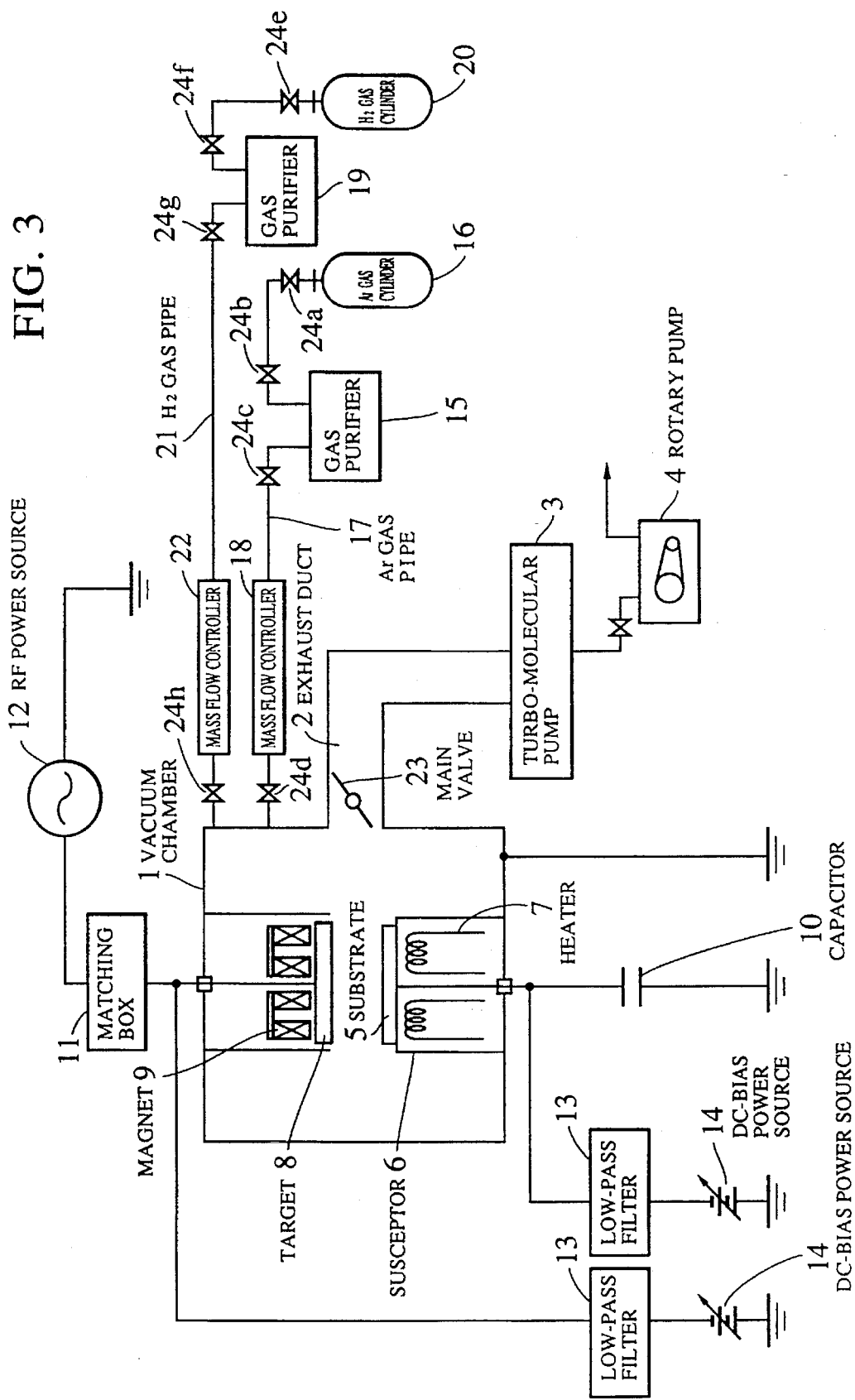
FIG. 3 is a schematic diagram illustrating an apparatus for use in deposition of a—Si according to the present invention.

FIG. 3 is a schematic diagram illustrating an example of an arrangement of a bias sputtering apparatus for use in the present invention. As shown in FIG. 3, the apparatus comprises a vacuum chamber 1, a turbo-molecular pump 3 for evacuation, a mechanical pump 4 such as a rotary pump, a substrate 5, a susceptor 6, heater 7 serving as heating means for heating the substrate 5, a target 8, a magnet 9, a capacitor 10, a matching box 11, an RF power source 12, a low-pass filter 13, a DC power source 14, gas purifiers 15 and 19, an Ar gas cylinder 16, an Ar gas supply pipe 17, mass flow controllers 18 and 22, a hydrogen gas cylinder 20, a hydrogen gas supply pipe 21, a main valve 23, and valves 24a–24h. Ar gas is supplied from the Ar gas cylinder 16 to the gas purifier 15 via the valves 24a and 24b. Impurities such as various particles included in the Ar gas are removed by the gas purifier 15, and then the Ar gas is supplied to the mass flow controller 18 via the Ar gas supply pipe 17. Responding to a control signal from a controller or the like (not shown), the mass flow controller 18 controls the flow of the Ar gas to a desired flow rate. The Ar gas passing through the mass flow controller 18 is supplied into the vacuum chamber 1 via the valve 24d. Similarly, a predetermined amount of hydrogen is supplied from the hydrogen gas cylinder 20 into the vacuum chamber 1 via the gas purifier 19, the hydrogen gas supply pipe 21, and the mass flow controller 22. The Ar and hydrogen gases introduced into the vacuum chamber in this way are used as discharging gases. The target 8 and the substrate 5 are placed in the vacuum chamber 1, and they are used as electrodes for the RF discharging. The substrate 5 and the target 8 are connected via the low pass filter to the DC bias power source so that a bias voltage may be applied to the substrate 5 and the target 8.

Now, an application of the present invention to a specific device will be described below.

As described above, the present invention may be applied to a variety of devices having a structure comprising a crystalline Si and an a—Si layer deposited on the crystalline Si. An example of such a device is a hetero-junction bipolar transistor. This device may be produced according to the following steps: a Si single crystal including a collector region which is to be a collector, as well as a base region formed on the collector region which is to be a base, is prepared first; then a tunnelling oxide film (about 10 Å) is formed on the base region; and finally an a—Si emitter is formed on the tunnelling oxide film according to the present invention. This structure can provide a large grounded-emitter current amplification factor $h_{FE}$.

In the present invention, the base region having the tunnelling oxide film is used as a substrate as described above, and thus it is possible to apply a bias voltage to the surface of the substrate. The a—Si for the emitter can be formed by sputtering a Si target with a mixed gas of Ar and H$_2$ in such a manner as described above.

By controlling the bias voltage applied to the substrate, the energy of Ar$^+$ and H$^+$ ions incident on the surface of the substrate can be controlled so that the energy may have an optimum value. Therefore, it becomes easy to reduce the structural defects in the a—Si layer, and to control the hydrogen concentration in the layer.

Another example is a photo sensor or an image sensor comprising a crystalline Si substrate including a reading circuit, and an a—Si photo detecting layer formed on the substrate. If the pi portion of a pin sensor made up of crystalline Si or a CCD having such a pin sensor is replaced with an a—Si pi structure according to the present invention, then a high efficiency of optical absorption of the a—Si layer can provide a high sensitivity optical sensor device.

In addition to those devices described above, various modifications in the structure comprising a crystalline Si substrate and an a—Si or a—Si alloy layer formed on the substrate are possible.

Referring to specific embodiments, the present invention will be described in more detail below.

Embodiment 1

In this embodiment, a p$^+$–Si wafer with a tunneling oxide film is used, and the processing is performed using a gas containing 7% hydrogen at a substrate temperature of 350° C.

An a—Si film is deposited on a p$^+$–Si wafer having a tunneling oxide film by using the bias sputtering apparatus shown in FIG. 3 according to the following steps. A Si single crystal FZ wafer having a diameter of 120 mm, thickness of 1 mm, specific volume resistance of 1500 Ωcm, is used as the target 8. A high purity mixed gas of Ar and hydrogen having a H$_2$O dew-point of −100° C. or lower is used as a discharging gas. Boron is implanted into the back surface of the target using ion implantation equipment so that the target may come into ohmic contact with the bias electrode thereby ensuring the application of a bias potential to the target. A p$^+$–Si wafer is used as the substrate 5. A 0.7 nm-thick tunnelling oxide film is formed on its surface by means of thermal oxidation so as to prevent the deposition film from being crystallized. The substrate 5 is placed on the substrate susceptor 6 in the vacuum chamber (hereafter referred to as deposition chamber) 1. Then, the inside of the chamber is evacuated to 10$^{-9}$ torr or lower. The substrate is heated with the substrate heater 7 provided in the substrate susceptor 6 so that the temperature of the substrate surface may be maintained at 350° C. After that, only Ar gas is introduced into the deposition chamber, and the Ar gas pressure is set to 10 mTorr. Bias voltages of −5 V and +5 V relative to the ground are applied to the target and the substrate, respectively, and 5 W discharging power is applied so that RF discharging occurs. The substrate is subjected to the ion bombardment so as to clean its surface. If RF power having a frequency of 100 MHz is used, and if the substrate is biased at +5 V, then the surface of the substrate is not damaged by ions at all. Subsequently, the mixed gas of Ar and hydrogen is introduced into the deposition chamber without breaking the vacuum, and a—Si is deposited on the substrate keeping the substrate temperature at 350° C. The a—Si deposition is carried out at a discharging frequency of 100 MHz, with the target biased at −150 V, with the substrate biased at +20 V, at a discharging power level of 100 W, at 15 mTorr total gas pressure of the Ar and hydrogen mixed gas, and at 0.5 mTorr partial gas pressure of hydrogen. Under these conditions, a—Si may be deposited at a deposition rate of about 5 nm/min. The film obtained in this way has been proved to have an amorphous structure, because a halo pattern can be observed when the X-ray diffraction or electron beam diffraction analysis is carried out on the film. The evaluation by means of infrared spectroscopy has revealed that the concentration of hydrogen incorporated into the a—Si film is about 7 at %. This value of the hydrogen content is rather lower than that obtained for an a—Si film which is formed on a glass substrate by a widely used RF plasma CVD technique with $SiH_4$ gas at 13.56 MHz at a substrate temperature of 350° C. Nevertheless, the film shows a spin density of about $5 \times 10^{15}$ $cm^{-3}$, which is lower than that of an a—Si film containing a similar concentration of hydrogen, formed by means of the RF plasma CVD technique. The degree of the photo-induced degradation in photoelectric characteristics is about a fifth of that for the a—Si film formed by the plasma CVD technique. It is very apparent that the a—Si film according to the present invention shows better characteristics than the a—Si film formed on a glass substrate by means of the RF plasma CVD technique.

Embodiment 2

In this embodiment, an amorphous FeCrPC alloy is used, and the processing is performed using a gas containing 9 % hydrogen at a substrate temperature of 280° C. An amorphous FeCrPC alloy having high corrosion resistance is used as the substrate 5, and an a—Si film is deposited on it in a similar manner to that in embodiment 1, using the apparatus shown in FIG. 3 according to the following steps. A Si single crystal FZ wafer having a diameter of 120 mm, thickness of 1 mm, specific volume resistance of 1500 Ωcm is used as the target 8. A high purity mixed gas of Ar and hydrogen having a $H_2O$ dew-point of $-100°$ C. or lower is used as a discharging gas. Boron is implanted into the back surface of the target using ion implantation equipment so that the target may come into ohmic contact with the bias electrode thereby ensuring the application of a bias potential to the target. An amorphous $FeCr_{10}P_{13}C_7$ alloy roll is cut into an appropriate size of substrate, and cleaned well. The substrate 5 is placed on the substrate susceptor 6 in the deposition chamber 1. Then, the inside of the chamber is evacuated to $10^{-9}$ torr or lower. The substrate is heated with the substrate heater 7 provided in the substrate susceptor 6 so that the temperature of the substrate surface may be maintained at 280° C. After that, only Ar gas is introduced into the deposition chamber, and the Ar gas pressure is set to 10 mTorr. Bias voltages of $-5$ V and $+5$ V relative to the ground are applied to the target and the substrate, respectively, and 5 W discharging power is applied so that RF discharging occurs. The substrate is subjected to the ion bombardment so as to clean its surface. If RF power having a frequency of 100 MHz is used, and if the substrate is biased at $+5$ V, then the surface of the substrate is not damaged by ions at all. Subsequently, the mixed gas of Ar and hydrogen is introduced into the deposition chamber without breaking the vacuum, and a—Si is deposited on the substrate keeping the substrate temperature at 350° C. The a—Si deposition is carried out at a discharging frequency of 100 MHz, with the target biased at $-150$ V, with the substrate biased at $+10$ V, at a discharging power level of 100 W, at 15 mTorr total gas pressure of the Ar and hydrogen mixed gas, and at 0.2 m torr partial gas pressure of hydrogen. Under these conditions, a—Si may be deposited at a deposition rate of about 5 nm/min. The film obtained in this way has been proved to have an amorphous structure, because a halo pattern can be observed when the X-ray diffraction or electron beam diffraction analysis is carried out on the film. The evaluation by means of infrared spectroscopy has revealed that the concentration of hydrogen incorporated into the a—Si film is about 9 at %. This value of the hydrogen content is rather lower than that obtained for an a—Si film which is formed on a glass substrate by a widely used RF plasma CVD technique with $SiH_4$ gas at 13.56 MHz at a substrate temperature of 280° C. Nevertheless, the film shows a spin density of about $5 \times 10^{15}$ $cm^{-3}$, which is lower than that of an a—Si film containing a similar concentration of hydrogen, formed by means of the RF plasma CVD technique. The degree of the photo-induced degradation in photoelectric characteristics is about a third of that for the a—Si film formed by the plasma CVD technique. It is very apparent that the a—Si film according to the present invention shows better characteristics than the a—Si film formed by means of the conventional plasma CVD technique.

Embodiment 3

In this embodiment, a Cr substrate with an oxide film is used, and the processing is performed using a gas containing 4% hydrogen at a substrate temperature of 400° C.

An a—Si film is deposited on a metallic Cr substrate, the surface of which is slightly oxidized, by using the apparatus shown in FIG. 3 according to the following steps. A Si single crystal FZ wafer having a diameter of 120 mm, thickness of 1 mm, and specific volume resistance of 1500 Ωcm is used as the target. A high purity mixed gas of Ar and hydrogen having a $H_2O$ dew-point of $-100°$ C. or lower is used as a discharging gas. Boron is implanted into the back surface of the target using ion implantation equipment so that the target may come into ohmic contact with the bias electrode thereby ensuring the application of a bias potential to the target. Metallic Cr is used as the substrate. A 1 nm-thick tunnelling oxide film is formed on its surface by means of thermal oxidation so as to prevent the deposited film from being crystallized. The thermal oxidation is carried out in the atmosphere of high purity $O_2$ gas (the concentration of impurity $H_2O$ is less than 10 ppb) diluted with high purity Ar gas (the concentration of impurity $H_2O$ is less than 5 ppb). Prior to the thermal oxidation, the native oxide layer on the surface of the Cr substrate is removed by an HF etchant or the like. The thermal oxidation is performed at a temperature in the range from 400° C. to 500° C. If the above-described conditions are used, it is possible to form a dense and pin-hole free $Cr_2O_3$ film having an amorphous structure. The substrate 5 is placed on the substrate susceptor 6 in the deposition chamber 1. Then, the inside of the chamber is evacuated to $10^{-9}$ torr or lower. The substrate is heated with the substrate heater 7 provided in the substrate susceptor 6 so that the temperature of the substrate surface may be maintained at 400° C. After that, only Ar gas is introduced into the deposition chamber, and the Ar gas pressure is set to 10 mTorr. Bias voltages of $-5$ V and $+5$ V relative to the ground are applied to the target and the substrate, respectively, and 5 W discharging power is applied so that RF discharging occurs. The substrate is subjected to the ion bombardment so as to clean its surface. If RF power having a frequency of 100 MHz is used, and if the substrate is biased at $+5$ V, then the surface of the substrate is not damaged by ions at all. Subsequently, the mixed gas of Ar and hydrogen is introduced into the deposition chamber without breaking the vacuum, and a—Si is deposited on the substrate keeping the substrate temperature at 400° C. The a—Si deposition is carried out at a discharging frequency of 100 MHz, with the target biased at $-150$ V, with the substrate biased at $+20$ V, at a discharging power level of 100 W, at 15 mTorr total gas pressure of the Ar and hydrogen mixed gas, and at 5 m torr partial gas pressure of hydrogen. Under these conditions, a—Si may be deposited at a deposition rate of about 3 nm/min. The film obtained in this way has been proved to have an amorphous structure, because a halo pattern can be observed when the X-ray diffraction or electron beam diffraction analysis is carried out on the film. The evaluation by means of infrared spectroscopy has revealed that the concentration of hydrogen incorporated into the a—Si film is about 4 at %. This value of the hydrogen content is rather lower than that obtained for an a—Si film which is formed on a glass substrate by a widely used RF plasma CVD technique with $SiH_4$ gas at 13.56 MHz at a substrate temperature of 400° C. Nevertheless, the film shows a spin density of about $1 \times 10^{16}$ $cm^{-3}$, which is lower than that of an a—Si film containing a similar concentration of hydrogen, formed by means of the RF plasma CVD technique. This a—Si film formed according to the present embodiment shows a very high photoelectric conductivity which is $10^4$ or more times that of the a—Si film formed by the plasma CVD technique. Besides, the a—Si film according to the present embodiment shows no photo-induced degradation. It is very apparent that the a—Si film according to the present invention shows better characteristics than the a—Si film formed by means of the conventional plasma CVD technique.

Embodiment 4

In this embodiment, an conductive organic film is used, and the processing is performed using a gas containing 15% hydrogen at a substrate temperature of 100° C.

A substrate 5 is prepared in such a manner that a polycarbonate resin having a molecular weight of about 80,000 and 40 wt % triphenylamine, wherein only one of three phenyl radicals is bonded to a methyl radical, as well as 0.5 wt % orthoquinone are mixed uniformly, and then coated on a nickel substrate to form a 1 µm-thick film. In this preparation, chloroform or the like may be used as a solvent. An a—Si film is deposited on this substrate by using the apparatus shown in FIG. 3 according to the following steps. A Si single crystal FZ wafer having a diameter of 120 mm, thickness of 1 mm, specific volume resistance of 1500 Ωcm is used as the target 8. A high purity mixed gas of Ar and hydrogen having a $H_2O$ dew-point of −100° C. or lower is used as a discharging gas. Boron is implanted into the back surface of the target using ion implantation equipment so that the target may come into ohmic contact with the bias electrode thereby ensuring the application of a bias potential to the target. The substrate 5, which has been prepared in the above-described manner is used. That is, polycarbonate is dissolved in chloroform, and further a triphenylamine derivative and orthoquinone are added to this and mixed well. Then, the mixture is coated on a nickel substrate to form a 1 µm-thick film, and dried. The substrate 5 is placed on the substrate susceptor 6 in the deposition chamber 1. Then, the inside of the chamber is evacuated to $10^{-9}$ torr or lower. The substrate is heated with the substrate heater 7 provided in the substrate susceptor 6 so that the temperature of the substrate surface may be maintained at 100° C. After that, only Ar gas is introduced into the deposition chamber, and the Ar gas pressure is set to 10 mTorr. Bias voltages of −5 V and +5 V relative to the ground are applied to the target and the substrate, respectively, and 5 W discharging power is applied so that RF discharging occurs. The substrate is subjected to the ion bombardment so as to clean its surface. If RF power having a frequency of 100 MHz is used, and if the substrate is biased at +5 V, then the surface of the substrate is not damaged by ions at all. Subsequently, the mixed gas of Ar and hydrogen is introduced into the deposition chamber without breaking the vacuum, and a—Si is deposited on the substrate keeping the substrate temperature at 100° C. The a—Si deposition is carried out at a discharging frequency of 100 MHz, with the target biased at −150 V, with the substrate biased at +20 V, at a discharging power level of 100 W, at 15 mTorr total gas pressure of the Ar and hydrogen mixed gas, and at 0.1 mTorr partial gas pressure of hydrogen. Under these conditions, a—Si may be deposited at a deposition rate of about 7 nm/min. The film obtained in this way has been proved to have an amorphous structure, because a halo pattern can be observed when the X-ray diffraction or electron beam diffraction analysis is carried out on the film. The evaluation by means of infrared spectroscopy has revealed that the concentration of hydrogen incorporated into the a—Si film is about 15 at %. This value of the hydrogen content is rather lower than that obtained for an a—Si film which is formed on a glass substrate by a widely used RF plasma CVD technique with $SiH_4$ gas at 13.56 MHz at a substrate temperature of 100° C. The film shows a spin density of about $8 \times 10^{15}$ $cm^{-3}$, which is lower than that of an a—Si film formed on a glass substrate at a substrate temperature of 100° C. by the widely used plasma CVD technique. This a—Si film formed according to the present embodiment shows a very high photoelectric conductivity which is about $10^5$ times that of the a—Si film formed by the widely used plasma CVD technique. It is very apparent that the a—Si film according to the present invention shows better characteristics than the a—Si film formed by means of the conventional plasma CVD technique.

Embodiment 5

In this embodiment, the invention is applied to a hertero-junction bipolar transistor (HBT) whose emitter is made up of a—Si:H having a bandgap of about 1.5 eV. This HBT is fabricated using the apparatus shown in FIG. 3 according to the following steps. An n-type single crystal Si epitaxial layer having a specific volume resistance of about 0.1 Ωcm and a thickness of about 4000 Å is grown on an $n^+$ (100)—Si wafer 41 having a specific volume resistance of about 0.01 Ωcm, by means of the RF bias sputtering technique at a discharging frequency of 100 MHz. An n-type Si having a specific volume resistance of about 0.1 Ωcm is used as the sputtering target. $P^+$ ions are implanted into the back surface of the target so that the back surface of the target may come into ohmic contact with the bias electrode. The substrate is placed on the substrate susceptor 6 in the vacuum chamber 1. Then, the inside of the chamber 1 is evacuated to $10^{-9}$ torr or lower with the turbo-molecular pump. The substrate is heated up to 400° C. High purity Ar gas having a $H_2O$ dew-point of −100° C. or lower is introduced into the chamber 1, and the Ar gas pressure is set to 15 mTorr. The substrate is subjected to the ion bombardment thereby cleaning its surface for 5 min, under the conditions where the target bias voltage is −5 V, the substrate bias voltage is +5 V, the discharging power is 5 W. Subsequently, a Si epitaxial layer is grown under the conditions where the target bias voltage is −150 V, the substrate bias voltage +20 V, and the discharging power 100 W, wherein the substrate temperature is kept at 400° C.

The substrate is taken out from the chamber 1, and then ion implantation is performed on the n-layer 42 so as to form a p-layer 43 having a carrier concentration of about $10^{18}$ $cm^{-3}$ and a thickness of about 1800 Å. Ion implantation is further performed on the obtained p-layer 43 so as to form an n-layer 44 having a carrier concentration of about $5 \times 10^{19}$ $cm^{-3}$ and a thickness of about 800 Å. Then, the LOCOS oxidation is performed to form an $SiO_2$ region 45 thereby isolating the device element. An $SiO_2$ layer 46 is deposited on this structure by means of CVD. The patterning is performed and an opening is formed to expose an area of the n-layer 44 where the emitter is to be formed later. Then, thermal oxidation is performed at 650° C. for 5 sec in the atmosphere of an N$_2$/O$_2$ mixed gas (with the O$_2$ concentration of about 10%) so as to form an about 10 Å-thick tunneling oxide film 47 on the exposed surface of the n-layer 44. Electronic charges can pass through this oxide layer 47. Therefore, the biasing to the surface of the substrate is possible through this oxide layer 47.

Figure 4:
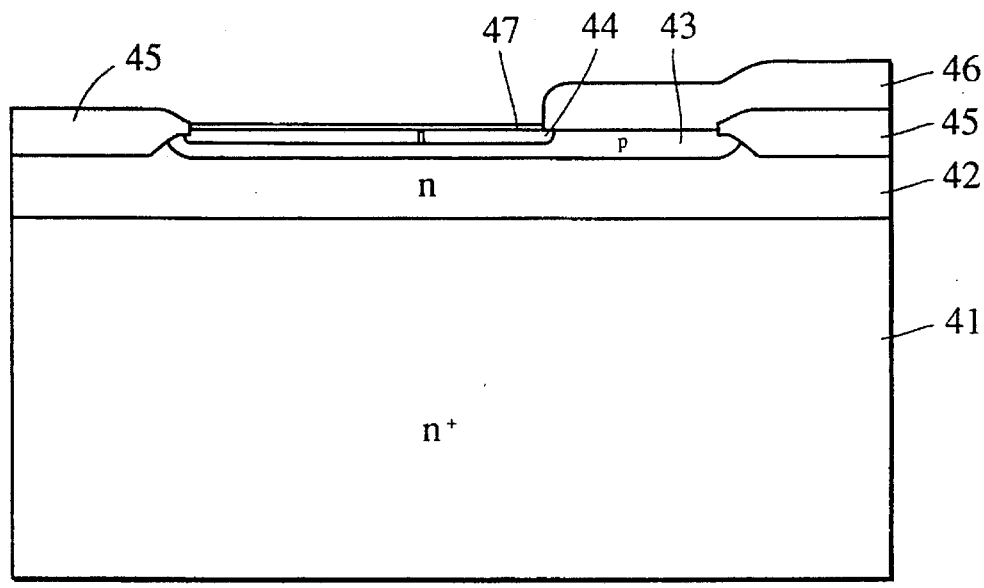
FIG. 4 is a cross-sectional view of a hetero-junction bipolar transistor according to the present invention, which is in the middle of the production process.
Figure 5:
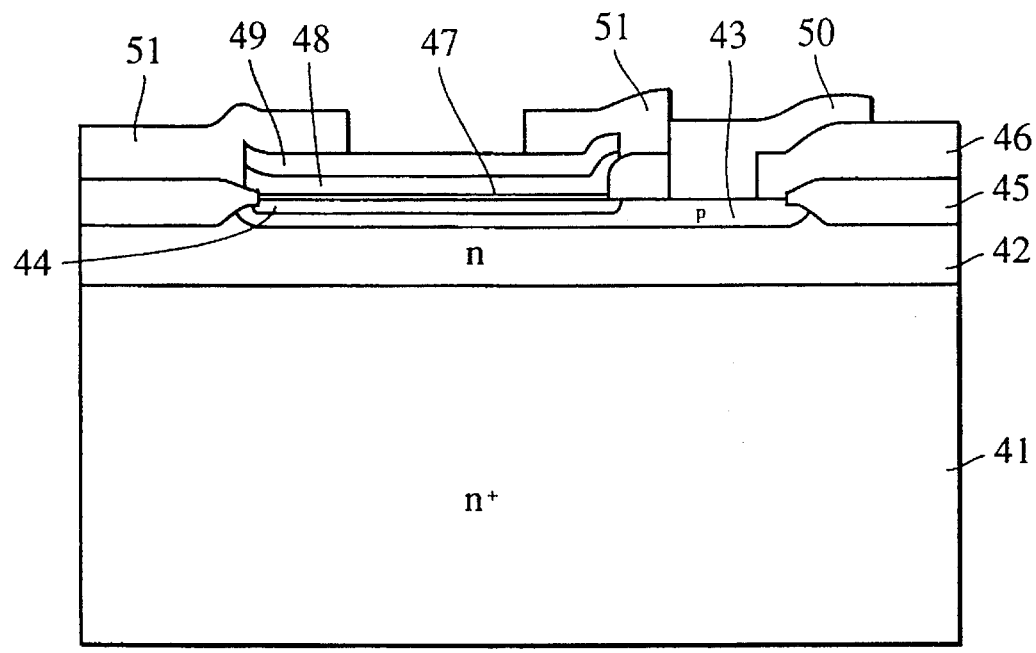
FIG. 5 is a cross-sectional view of a hertero-junction bipolar transistor according to the present invention.

On the surface of this structure, an n-type a—Si:H film having a thickness of about 500, which is to be used as an emitter, is formed according to the steps which will be described later. The a—Si:H film according to this technique has a lower hydrogen concentration, a lower spin density, and better carrier transport properties as compared to an a—Si:H film deposited by using the widely used RF plasma CVD technique with SiH$_4$ gas. The a—Si:H film is formed as follows. An n-type Si wafer having specific resistance of 0.01 Ωcm is used as a target. The substrate having the structure shown in FIG. 4 is placed again on the substrate susceptor 6 of the apparatus shown in FIG. 3. Then, the inside of the chamber 1 is evacuated to $10^{-9}$ torr or lower with the turbo-molecular pump. After heating the substrate up to 350° C., the substrate is subjected to the ion bombardment in the Ar gas plasma thereby cleaning its surface for 5 min under the conditions where the target bias voltage is −5 V, the substrate bias voltage +5 V, the pressure 10 mTorr, the discharging frequency 100 MHz, and the discharging power 5 W. Then, an a—Si:H film is deposited by the sputtering technique using a mixed gas comprising Ar and H$_2$ (with the H$_2$ concentration of 3 mol %). The deposition conditions are as follows: the pressure is 15 mTorr, the target bias voltage −150 V, the substrate bias voltage +20 V, the discharging frequency 100 MHz, and the discharging power 100 W. The presence of the thin oxide film 47 on the surface of the n-layer 44 causes the deposited film 48 to become amorphous, and to have a hydrogen concentration less than 7%. This film has a high hole mobility which is 1 to 2 orders greater than obtained in an a—Si:H formed by a plasma CVD technique. The film produced under the above conditions has a bandgap of about 1.55 eV. On this a—Si:H film, an n$^+$-polysilicon layer 49 is subsequently deposited without breaking the vacuum under the conditions where the substrate temperature is 420° C., the target bias voltage −150 V, the substrate bias voltage +15 V, the discharging pressure 15 m torr, the discharging power 100 W, the H$_2$ concentration of the Ar/H$_2$ mixed gas 50 mol %. An SiO$_2$ layer 51, an electrode 50, etc., are further formed as required to complete a bipolar transistor. The HBT (hertero-junction bipolar transistor) which has been fabricated in the above-described manner, and which has a structure shown in FIG. 5, exhibits as great grounded-emitter current amplification factor h$_{FE}$ as 400. In contrast, the great grounded-emitter current amplification factor h$_{FE}$ is only 100 for the conventional type single crystal HBT which was fabricated for comparison wherein the conventional HBT has the same structure in the collector and the base as that of the present invention while the a—Si emitter is replaced with an n-type single crystal Si emitter. Thus, it is apparent that the HBT according to the present invention can have greater h$_{FE}$ than the conventional HBT.

According to the present invention, as described above, it is possible to perform rigid control of the substrate biasing in the deposition of a—Si or a—Si alloys utilizing the RF plasma having a frequency higher than 50 MHz. As a result, the energy of ions incident on the substrate can be precisely controlled, and thus the controllability of the deposition process can be improved, whereby it becomes possible to control the film quality in a wider range. The present invention may be applied to a variety of applications including a solar cell, TFT, solid-state image sensor device, light sensitive material for electrophotography, thin film device such as LED, photo sensing device, light emitting device, etc., thereby improving the characteristics of these devices.

What is claimed is:

1. A method of producing an amorphous semiconductor element comprising a substrate and an amorphous semiconductor thereon employing an apparatus comprising at least:

a DC power source for applying a bias voltage between a target and a substrate wherein said target disposed at a location opposite to said substrate on which an amorphous semiconductor is to be formed; and a high frequency power source for applying high frequency power between said target and said substrate;

comprising the steps of:

forming a surface layer comprising an amorphous structure, said surface layer being a tunnel oxide film formed on said substrate; and depositing an amorphous semiconductor containing at least an element included in said target on said surface layer of said substrate by utilizing a high frequency plasma having a frequency greater than 50 MHz in an atmosphere whose partial gas pressure associated with a residual gas other than inert gas and hydrogen is less than $10^{-8}$ torr, while applying a bias voltage including a DC component to said substrate during the deposition.

2. A method according to claim 1, wherein said step of forming a surface layer having an amorphous structure includes a step of performing thermal oxidation on the surface of a silicon wafer.

3. A method according to claim 2, wherein said step of forming a surface layer having an amorphous structure further includes a step of etching the surface of said silicon wafer before said step of the thermal oxidation.

4. A method according to claim 2, wherein said step of forming a surface layer having an amorphous structure further includes a step of removing a native oxide film on said silicon wafer before said step of the thermal oxidation.

5. A method according to claim 2, wherein said step of thermal oxidation is performed in an atmosphere containing oxygen.

6. A method according to claim 2, wherein said atmosphere containing oxygen further containing nitrogen gas.

7. A method according to claim 6, wherein said concentration of said oxygen is at least about 20% relative to that of said nitrogen gas.

8. A method according to claim 1, wherein said amorphous semiconductor is an amorphous semiconductor containing silicon, formed by utilizing a target containing silicon.

9. A method of producing an amorphous semiconductor element comprising a substrate and an amorphous semiconductor thereon employing an apparatus comprising at least:

a DC power source for applying a bias voltage between a target and a substrate wherein said target disposed at a location opposite to said substrate on which an amorphous semiconductor is to be formed; and a high frequency power source for applying high frequency power between said target and said substrate;

comprising the steps of;

forming a surface layer comprising an oxide film having an amorphous structure containing p-type or n-type dopant on said substrate; and depositing an amorphous semiconductor containing at least an element included in said target on said surface layer of said substrate by utilizing a high frequency plasma having a frequency greater than 50 MHz in an atmosphere whose partial gas pressure associated with a residual gas other than inert gas and hydrogen is less than $10^{-8}$ torr, while applying a bias voltage including a DC component to said substrate during the deposition.

10. A method according to claim 9, wherein said step of forming a surface layer having an amorphous structure includes a step of performing thermal oxidation on the surface of a silicon wafer.

11. A method according to claim 10, wherein said step of forming a surface layer having an amorphous structure further includes a step of etching the surface of said silicon wafer before said step of the thermal oxidation.

12. A method according to claim 10, wherein said step of forming a surface layer having an amorphous structure further includes a step of removing a native oxide film on said silicon wafer before said step of the thermal oxidation.

13. A method according to claim 10, wherein said step of thermal oxidation is performed in an atmosphere containing oxygen.

14. A method according to claim 13, wherein said atmosphere containing oxygen further contains nitrogen gas.

15. A method according to claim 14, wherein the concentration of said oxygen is at least about 20% relative to that of said nitrogen gas.

16. A method according to claim 9, wherein said amorphous semiconductor substrate is an amorphous semiconductor substrate containing silicon, formed by utilizing a target containing silicon.

17. A method according to claim 1, wherein said oxide layer of said surface layer is metal oxide film.

18. A method according to claim 1, wherein the thickness of said surface layer is 5 nm or less.

19. A method according to claim 9, wherein the thickness of said surface layer is 5 nm or less.

20. A method of producing an amorphous semiconductor element comprising a substrate and an amorphous semiconductor thereon employing an apparatus comprising at least:

a DC power source for applying a bias voltage between a target and a substrate wherein said target is disposed at a location opposite to said substrate on which an amorphous semiconductor is to be formed; and a high frequency power source for applying high frequency power between said target and said substrate;

comprising the steps of:

forming a surface layer comprising an amorphous structure in which electric charge can flow, said surface layer being on said substrate; and depositing an amorphous semiconductor containing at least an element included in said target on said surface layer of said substrate by utilizing a high frequency plasma having a frequency greater than 50 MHz in an atmosphere whose partial gas pressure associated with a residual gas other than inert gas and hydrogen is less than $10^{-8}$ torr, while applying a bias voltage including a DC component to said substrate during the deposition.

21. A method according to claim 20, wherein said step of forming the surface layer includes a step of performing thermal oxidation on the surface of silicon wafer.

22. A method according to claim 21, wherein said step of forming the surface layer further includes a step of etching the surface of said silicon wafer before said step of thermal oxidation.

23. A method according to claim 21, wherein said step of forming the surface layer further includes a step of removing a native oxide film before said step of the thermal oxidation.

24. A method according to claim 21, wherein said step of thermal oxidation is performed in an atmosphere containing oxygen.

25. A method according to claim 24, wherein said atmosphere containing oxygen further containing nitrogen gas.

26. A method according to claim 25, wherein the concentration of said oxygen is at least about 20% relative to that of said nitrogen gas.

27. A method according to claim 20, wherein said surface layer is a nitride film.

28. A method according to claim 19, wherein said surface layer is an oxide film.

29. A method according to claim 28, wherein said oxide layer is a metal oxide film.

30. A method according to claim 20, wherein said surface layer is an organic material having low resistance.

31. A method according to claim 20, wherein said surface layer is organic material in which low molecular weight and electron donative material is added to an amorphous high polymeric weight organic material and then the electron donative material is partially oxidized by adding low molecular weight electron attractive material.

* * * * *

UNITED STATES PATENT AND TRADEMARK OFFICE
CERTIFICATE OF CORRECTION

PATENT NO. : 5,563,092                    Page 1 of 4

DATED      : October 8, 1996

INVENTOR   : KAZUAKI OHMI

It is certified that error appears in the above-identified patent and that said Letters Patent is hereby corrected as shown below:

ON TITLE PAGE

[56] References Cited "5-216990  2/1977  Japan" should read --52-16990  2/1977 Japan--.

COLUMN 1

Line 35,  "R.C. Chittic et. at.," should read --R.C. Chittick et. al.,--;
Line 36,  "et. at.," should read --et al.,--;
Line 59,  "view point," should read --viewpoint--.

COLUMN 3

Line 3,   "self biasing" should read --self-biasing--;
Line 34,  "10-8 torr" should read --$10^{-8}$ torr--.

COLUMN 4

Line 20,  "disposed" should read --is disposed--.

UNITED STATES PATENT AND TRADEMARK OFFICE
CERTIFICATE OF CORRECTION

PATENT NO. : 5,563,092

DATED : October 8, 1996

INVENTOR : KAZUAKI OHMI

It is certified that error appears in the above-identified patent and that said Letters Patent is hereby corrected as shown below:

COLUMN 6

Line 3,  "so called" should read --so-called--;
  Line 26, "technique" should read --technique,--;
  Line 58, "O," should read --O,--.

COLUMN 7

Line 37, "higher" should read --higher than --.

COLUMN 8

Line 57, "hydrogen" should read --hydrogen and/or--.

COLUMN 13

Line 23, "an" should read --a--.

COLUMN 14

Line 28, "hertero-" should read --hetero- --.

UNITED STATES PATENT AND TRADEMARK OFFICE
CERTIFICATE OF CORRECTION

PATENT NO. : 5,563,092

DATED : October 8, 1996

INVENTOR : KAZUAKI OHMI

Page 3 of 4

It is certified that error appears in the above-identified patent and that said Letters Patent is hereby corrected as shown below:

COLUMN 16

| Line 10, | "disposed" should read --is disposed--; |
| Line 43, | "claim 2," should read --claim 5,--; |
| Line 44, | "further containing" should read --further contains--; |
| Line 56, | "disposed" should read --is disposed--; |
| Line 62, | "of;" should read --of:--. |

COLUMN 18

Line 15, "silicon" should read --a silicon--;

UNITED STATES PATENT AND TRADEMARK OFFICE
CERTIFICATE OF CORRECTION

PATENT NO. : 5,563,092

DATED : October 8, 1996

INVENTOR : KAZUAKI OHMI

It is certified that error appears in the above-identified patent and that said Letters Patent is hereby corrected as shown below:

COLUMN 18

Line 27, "further containing" should read --further contains--;
Line 40, "organic" should read --an organic--.

Signed and Sealed this

Twenty-fifth Day of March, 1997

Attest:

BRUCE LEHMAN

Attesting Officer     Commissioner of Patents and Trademarks